(12) United States Patent
Lin

(10) Patent No.: US 12,276,043 B2
(45) Date of Patent: Apr. 15, 2025

(54) SILICON CARBIDE INGOT AND METHOD OF FABRICATING THE SAME

(71) Applicant: GlobalWafers Co., Ltd., Hsinchu (TW)

(72) Inventor: Ching-Shan Lin, Hsinchu (TW)

(73) Assignee: GlobalWafers Co., Ltd., Hsinchu (TW)

( * ) Notice: Subject to any disclaimer, the term of this patent is extended or adjusted under 35 U.S.C. 154(b) by 737 days.

(21) Appl. No.: 17/385,914

(22) Filed: Jul. 27, 2021

(65) Prior Publication Data
US 2022/0025548 A1    Jan. 27, 2022

Related U.S. Application Data

(60) Provisional application No. 63/139,270, filed on Jan. 19, 2021, provisional application No. 63/056,732, filed on Jul. 27, 2020.

(51) Int. Cl.

| | |
|---|---|
| *C30B 29/36* | (2006.01) |
| *C01B 32/956* | (2017.01) |
| *C30B 23/00* | (2006.01) |
| *C30B 23/06* | (2006.01) |
| *C30B 25/10* | (2006.01) |
| *C30B 25/16* | (2006.01) |
| *H10D 62/60* | (2025.01) |
| *H10D 62/832* | (2025.01) |

(52) U.S. Cl.
CPC .......... *C30B 29/36* (2013.01); *C01B 32/956* (2017.08); *C30B 23/002* (2013.01); *C30B 23/066* (2013.01); *C30B 25/10* (2013.01); *C30B 25/165* (2013.01); *H10D 62/60* (2025.01); *H10D 62/8325* (2025.01); *C01P 2002/52* (2013.01); *C01P 2006/10* (2013.01); *C01P 2006/40* (2013.01)

(58) Field of Classification Search
CPC ..... C30B 29/36; C30B 23/002; C30B 23/066; C30B 25/10; C30B 25/165; C01B 32/956; H01L 29/1608; H01L 29/36; C01P 2002/52; C01P 2006/10; C01P 2006/40
See application file for complete search history.

(56) References Cited

U.S. PATENT DOCUMENTS

| | | |
|---|---|---|
| 5,856,231 A | 1/1999 | Niemann et al. |
| 7,018,597 B2 | 3/2006 | Ellison et al. |
| 9,090,989 B2 | 7/2015 | Zwieback et al. |

(Continued)

FOREIGN PATENT DOCUMENTS

| | | |
|---|---|---|
| CN | 102560672 | 7/2012 |
| CN | 104364428 | 2/2015 |

(Continued)

OTHER PUBLICATIONS

Hao, Jianmin, et al. "Growth of 2-inch V-doped bulk 6H-SiC with high semi-insulating yield." Journal of electronic materials 39 (2010): 530-533.*

(Continued)

*Primary Examiner* — Richard M Rump
(74) *Attorney, Agent, or Firm* — JCIPRNET

(57) ABSTRACT

A silicon carbide ingot is provided, which includes a seed end, and a dome end opposite to the seed end. In the silicon carbide ingot, a ratio of the vanadium concentration to the nitrogen concentration at the seed end is in a range of 5:1 to 11:1, and a ratio of the vanadium concentration to the nitrogen concentration at the dome end is in a range of 2:1 to 11:1.

6 Claims, 2 Drawing Sheets

(56) References Cited

U.S. PATENT DOCUMENTS

| | | | |
|---|---|---|---|
| 9,322,110 | B2 | 4/2016 | Zwieback et al. |
| 9,601,641 | B1 | 3/2017 | Quick et al. |
| 2005/0126471 | A1 | 6/2005 | Jenny et al. |
| 2008/0220232 | A1 | 9/2008 | Nakabayashi et al. |
| 2011/0266556 | A1 | 11/2011 | Leonard et al. |
| 2019/0106811 | A1* | 4/2019 | Lin .................. C30B 29/36 |

FOREIGN PATENT DOCUMENTS

| | | |
|---|---|---|
| CN | 105209671 | 12/2015 |
| CN | 104775149 | 9/2017 |
| CN | 109280966 | 1/2019 |
| JP | 2015098420 | 5/2015 |
| JP | 2019112256 | 7/2019 |

OTHER PUBLICATIONS

Bickermann, M., R. Weingärtner, and A. Winnacker. "On the preparation of vanadium doped PVT grown SiC boules with high semi-insulating yield." Journal of crystal growth 254.3-4 (2003): 390-399.*

Krishnan, Bharat, et al. "Use of Vanadium Doping for Compensated and Semi-Insulating SiC Epitaxial Layers for SIC Device Applications." Materials Science Forum. vol. 717. Trans Tech Publications Ltd, 2012.*

"Notice of allowance of Taiwan Counterpart Application", issued on Mar. 1, 2022, p. 1-p. 4.

J.R. Jenny et al., "Deep level transient spectroscopic and Hall effect investigation of the position of the vanadium acceptor level in 4H and 6H SiC," Appl. Phys. Lett., vol. 68, Apr. 1996, pp. 1-4.

V. Balakrishna et al., "Impurity Effects in the Growth of 4H-SiC Crystals by Physical Vapor Transport," Mrs Online Proceedings Library, vol. 572, Feb. 2011, pp. 245-252.

Wu; Huiwang et al., "Influence Factors of High Purity Semi-Insulating SiC Resistivit", Micronanoelectronic Technology, with English abstract, Apr. 2020, pp. 320-323, 328, vol. 57, No. 4.

"Office Action of China Counterpart Application", issued on Jan. 8, 2024, p. 1-p. 7.

* cited by examiner

SILICON CARBIDE INGOT AND METHOD OF FABRICATING THE SAME

CROSS-REFERENCE TO RELATED APPLICATION

This application claims the priority benefit of U.S. provisional application Ser. No. 63/056,732, filed on Jul. 27, 2020, and U.S. provisional application Ser. No. 63/139,270, filed on Jan. 19, 2021. The entirety of each of the above-mentioned patent applications is hereby incorporated by reference herein and made a part of this specification.

BACKGROUND

Technical Field

This disclosure relates to a silicon carbide ingot, and in particular to a silicon carbide ingot with a uniformed high resistivity and a method of fabricating the same.

Description of Related Art

Currently, silicon wafers have been widely used in the semiconductor industry. Many electronic devices contain silicon chips that are produced using silicon wafers as materials. However, in order to improve the performance of the chip, currently, many manufacturers are trying to use silicon carbide wafers as materials to produce silicon carbide chips. The silicon carbide wafers have the advantages of high temperature resistance and high stability.

Silicon carbide wafers are generally formed by cutting silicon carbide ingots. Therefore, the quality of silicon carbide ingots directly affects the quality of subsequent wafers/chips. In the related art, high-resistance ingots usually suffer from deterioration in quality uniformity. The resistivity distribution of the ingots at the seed end and the dome end is uneven, and it is not easy to control the doping. Based on this, how to produce silicon carbide ingots with high resistance uniformity and high resistivity remains a challenge.

SUMMARY

This disclosure provides a silicon carbide ingot and a method of fabricating the same, which may produce a silicon carbide ingot with high resistance uniformity and high resistivity.

Some embodiments of the disclosure provide a silicon carbide ingot, which includes a seed end and a dome end opposite to the seed end. A ratio of vanadium concentration to nitrogen concentration at the seed end is in a range of 5:1 to 11:1, and a ratio of the vanadium concentration to the nitrogen concentration at the dome end is in a range of 2:1 to 11:1.

In some embodiments of the disclosure, a portion of the seed end with a resistivity higher than $10^{12}$ Ω·cm occupies 100% of an area of the seed end, and a portion of the dome end with a resistivity higher than $10^{12}$ Ω·cm occupies more than 90% of an area of the dome end.

In some embodiments of the disclosure, the portion of the dome end with the resistivity higher than $10^{12}$ Ω·cm occupies 100% of the area of the dome end.

In some embodiments of the disclosure, the vanadium concentration at the seed end and the dome end is within a range of $10^{17}$ atoms/cm$^3$ to $9.9*10^{17}$ atoms/cm$^3$.

In some embodiments of the disclosure, the vanadium concentration at the seed end is within a range of $5*10^{17}$ atoms/cm$^3$ to $9.9*10^{17}$ atoms/cm$^3$.

In some embodiments of the disclosure, the vanadium concentration at the dome end is within a range of $10^{17}$ atoms/cm$^3$ to $5*10^{17}$ atoms/cm$^3$.

In some embodiments of the disclosure, the nitrogen concentration at the seed end and the dome end is within a range of $10^{16}$ atoms/cm$^3$ to $9.9*10^{16}$ atoms/cm$^3$.

In some embodiments of the disclosure, the nitrogen concentration at the seed end is within a range of $5*10^{16}$ atoms/cm$^3$ to $9.9*10^{16}$ atoms/cm$^3$.

In some embodiments of the disclosure, the nitrogen concentration at the dome end is within a range of $10^{16}$ atoms/cm$^3$ to $5*10^{16}$ atoms/cm$^3$.

Some embodiments of the disclosure further provide a method of fabricating a silicon carbide ingot, which includes the following steps. A raw material containing carbon and silicon and a seed crystal located above the raw material are provided in a reactor. Argon gas and vanadium gas are introduced into the reactor. The reactor and the raw material are heated, so as to obtain silicon carbide ingots. The silicon carbide crystal ingot includes a seed end and a dome end opposite to the seed end, and the seed end is an end of the silicon carbide crystal ingot close to the seed crystal, and the dome end is an end of the silicon carbide crystal ingot far away from the seed crystal.

In some embodiments of the disclosure, a flow rate of the argon gas introduced into the reactor is in a range of 70 sccm to 80 sccm.

In some embodiments of the disclosure, a temperature at which the vanadium gas is introduced into the reactor is in a range of 2100° C. to 2250° C.

In some embodiments of the disclosure, after the argon gas and the vanadium gas are introduced into the reactor, gas pressure in the reactor is enabled to be between 0.1 and 100 torr.

In some embodiments of the disclosure, a thickness of the silicon carbide ingot is between 5 mm and 80 mm.

In some embodiments of the disclosure, a ratio of vanadium concentration at the seed end to the dome end is in a range of 1.2:1 to 7:1, and a ratio of nitrogen concentration at the seed end to the dome end is in a range of 1.7:1 and 3:1.

Based on the above, the silicon carbide ingot formed by the method of fabricating the same according to the embodiment of the disclosure is doped by introducing gaseous molecules of vanadium, and the doping concentration of vanadium and the concentration of nitrogen are controlled within a certain proportional relationship, which enables the silicon carbide crystal ingots to have high resistance uniformity and high resistivity.

To make the abovementioned more comprehensible, several embodiments accompanied by drawings are described in detail as follows.

DESCRIPTION OF THE EMBODIMENTS

Figure 1:
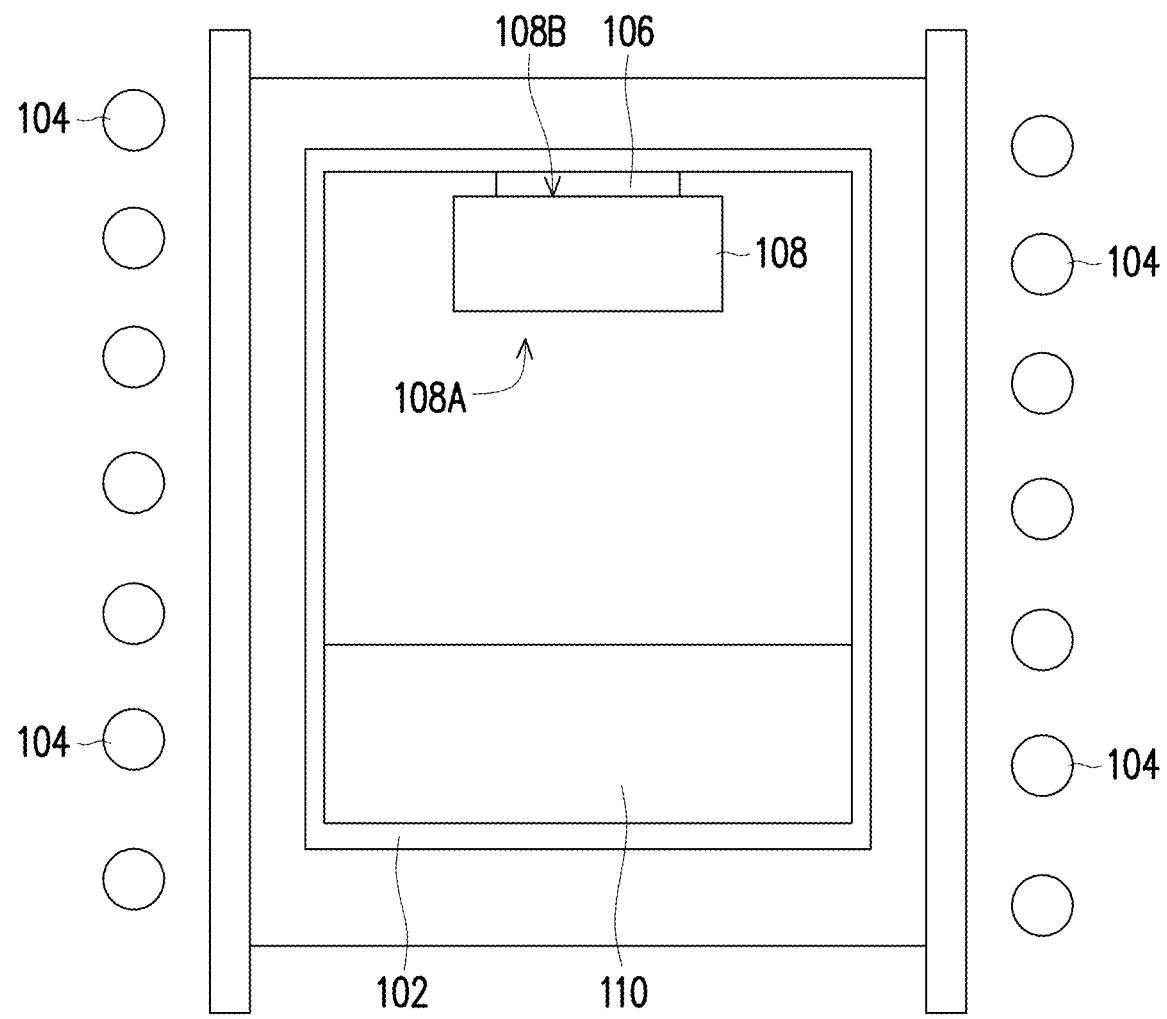
FIG. 1 is a schematic diagram of an ingot growth device according to an embodiment of the disclosure.
Figure 2:
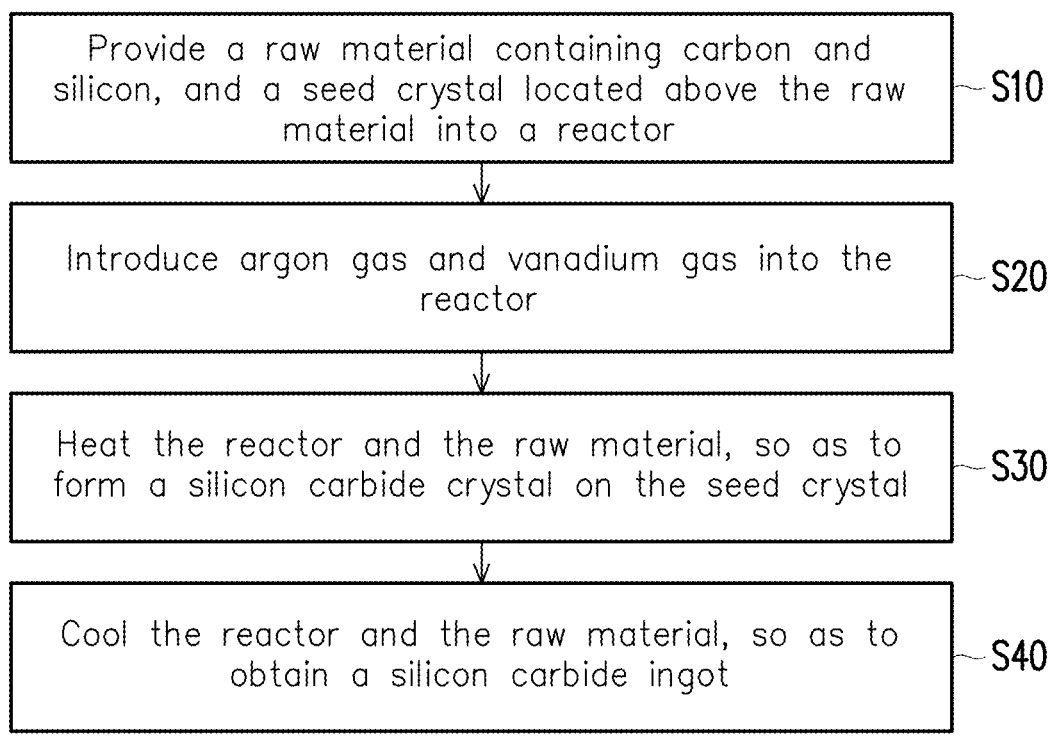
FIG. 2 is a flowchart of a method of fabricating a silicon carbide crystal according to an embodiment of the disclosure.

FIG. 1 is a schematic diagram of an ingot growth device according to an embodiment of the disclosure. FIG. 2 is a flowchart of a method of fabricating a silicon carbide ingot according to an embodiment of the disclosure. Hereinafter, the method of fabricating the silicon carbide ingot according to some embodiments of the disclosure are described with reference to the ingot growth equipment in FIG. 1 and in conjunction with the flowchart in FIG. 2.

As shown in Step S10 of FIGS. 1 and 2, in an ingot growth process, a raw material 110 containing carbon and silicon and a seed crystal 106 located above the raw material 110 are provided in a reactor 102. For example, the raw material 110 is, for example, silicon carbide powder, which is placed at a bottom end of the reactor 102 to serve as a solid evaporation source. The seed crystal 106 is disposed at a top end of the reactor 102. In some embodiments, the seed crystal 106 may be fixed on a seed crystal carrier (not shown) by an adhesive layer. A material of the seed crystal 106 includes silicon carbide. For example, the seed crystal 106 is 6H silicon carbide or 4H silicon carbide.

As shown in Step S20 of FIGS. 1 and 2, in some embodiments, when the raw material 110 and the seed crystal 106 are disposed in the reactor 102, outside air also enters the reactor 102 together, so that the reactor 102 contains oxygen, nitrogen and other gases. Therefore, argon gas is introduced into the reactor 102 to expel gases such as oxygen and nitrogen, so as to form a vacuum environment. However, there is still a small amount of nitrogen present in the reactor 102. Therefore, vanadium gas is introduced into the reactor 102 and the gaseous molecules of vanadium are used for doping. This may prevent an issue of limited solubility during usage of solid vanadium, and the introduction of the argon gas into the reactor 102 serve as a carrier for vanadium gas to facilitate occurrence of a chemical reaction.

In some embodiments, a flow rate of the argon gas introduced into the reactor 102 is less than 200 sccm. In some embodiments, the flow rate of the argon gas introduced into the reactor 102 is 150 sccm or less. In some embodiments, the flow rate of the argon gas introduced into the reactor 102 is in a range of 10 sccm to 100 sccm. In some preferred embodiments, the flow rate of the argon gas introduced into the reactor 102 is in a range of 70 sccm to 80 sccm. In addition, duration of introducing the argon gas into the reactor 102 is between 50 hours and 300 hours. In some embodiments, the duration of introducing the argon gas into the reactor 102 is between 60 hours and 200 hours. In some embodiments, the duration of introducing the argon gas into the reactor 102 is between 60 hours and 150 hours.

In some embodiments, a temperature at which the vanadium gas is introduced into the reactor 102 is in a range of 2000° C. to 2300° C. In some embodiments, the temperature at which the vanadium gas is introduced into the reactor 102 is in a range of 2100° C. to 2250° C. In addition, duration of introducing the vanadium gas into the reactor 102 is between 50 hours and 300 hours. In some embodiments, the duration of introducing the vanadium gas into the reactor 102 is between 60 hours and 200 hours. In some embodiments, the duration of introducing the vanadium gas into the reactor 102 is between 60 hours and 150 hours.

In some embodiments, after the argon gas and the vanadium gas are introduced into the reactor 102, a pressure in the reactor 102 is enabled to be between 0.1 and 100 torr, and more preferably, the pressure in the reactor 100 is enabled to be between 0.1 and 20 torr.

Next, with reference to Step S30 in FIGS. 1 and 2, the reactor 102 and the raw material 110 are heated to form a silicon carbide crystal 108 on the seed crystal 106. For example, the silicon carbide crystal 108 is formed on the seed crystal 106 by physical vapor transport (PVT). In some embodiments, the reactor 102 and the raw material 110 are heated by an induction coil 104 to form the silicon carbide crystal 108 on the seed crystal 106. During the process, the seed crystal 106 accepts solidification of the gaseous raw material 110 (silicon carbide powder), and the semiconductor crystal on the seed crystal 106 grows slowly until the silicon carbide crystal 108 with a desired size is obtained.

With reference to Step S40 in FIGS. 1 and 2, after the silicon carbide crystal 108 has grown to a desired size, a silicon carbide crystal ingot may be obtained. The silicon carbide ingot includes a seed end 108B and a dome end 108A opposite to the seed end 108B, and the seed end 108B is an end of the silicon carbide ingot close to the seed crystal 106, and the dome end 108A is an end of the silicon carbide ingot far away from the seed crystal 106. In some embodiments, the formed crystal ingot may have different crystal structures depending on a crystal orientation of the single seed crystal used. For example, ingots of silicon carbide include a 4H-silicon carbide, a 6H-silicon carbide, and so on. The 4H-silicon carbide and the 6H-silicon carbide belong to a hexagonal crystal system.

Then, the silicon carbide crystal ingot (silicon carbide crystal 108) may be taken out of the reactor 100. A thickness of the formed silicon carbide ingot is 5 mm to 80 mm, for example, 5 mm to 50 mm or 5 mm to 30 mm. In some embodiments, a ratio of vanadium concentration at the seed end 108B to the dome end 108A of the silicon carbide crystal ingot is in a range of 1.2:1 to 7:1, and a ratio of nitrogen concentration at the seed end 108B to the dome end 108A is in a range of 1.7:1 to 3:1. In some preferred embodiments, the ratio of the vanadium concentration at the seed end 108B to the dome end 108A of the silicon carbide crystal ingot is in a range of 1.5:1 to 2.5:1, and the ratio of the nitrogen concentration at the seed end 108B to the dome end 108A is in a range of 1.8:1 to 2.9:1. In addition, in some embodiments, a ratio (V:N) of the vanadium concentration to the nitrogen concentration at the seed end 108B is 5:1 to 11:1. In some embodiments, a ratio of the vanadium concentration to the nitrogen concentration (V:N) at the dome end 108A is 2:1 to 11:1.

In some embodiments, the vanadium concentration at the seed end 108B and the dome end 108A is controlled within a range of $10^{17}$ atoms/cm$^3$ to $9.9*10^{17}$ atoms/cm$^3$. More specifically, the vanadium concentration at the seed end 108B is controlled within a range of $5*10^{17}$ atoms/cm$^3$ to $9.9*10^{17}$ atoms/cm$^3$. The vanadium concentration at the dome end 108A is controlled within a range of $10^{17}$ atoms/cm$^3$ to $5*10^{17}$ atoms/cm$^3$. In addition, in some embodiments, the nitrogen concentration at the seed end 108B and the dome end 108A is controlled within a range of $10^{16}$ atoms/cm$^3$ to $9.9*10^{16}$ atoms/cm$^3$. More specifically, the nitrogen concentration at the seed end 108B is controlled within a range of $5*10^{16}$ atoms/cm$^3$ to $9.9*10^{16}$ atoms/cm$^3$. The nitrogen concentration at the dome end 108A is controlled within a range of $10^{16}$ atoms/cm$^3$ to $5*10^{16}$ atoms/cm$^3$.

Through the specific nitrogen concentration and vanadium doping concentration ratio, in addition to the adjustment of the flow rate of the argon gas and the temperature at which the vanadium gas is introduced in the process, the silicon carbide crystal ingot is enabled to have high uniformity and high resistivity. For example, in the embodiment of the disclosure, a portion of the seed end 108B with a resistivity higher than $10^{12}$ Ω·cm occupies 100% of an area of the seed end 108B, and a portion of the dome end 108A with a resistivity higher than $10^{12}$ Ω·cm occupies more than 90% of an area of the dome end 108A. In some preferred embodiments, the portion of the seed end 108B with the resistivity higher than $10^{12}$ Ω·cm occupies 100% of the area of the seed end 108B, and the portion of the dome end 108A with the resistivity higher than $10^{12}$ Ω·cm occupies 100% of the area of the dome end 108A.

In order to establish that the method of fabricating the silicon carbide ingot of the disclosure may bring about a silicon carbide ingot with high uniformity of resistance and high resistivity, experimental examples are described below as illustration. Several experiments are listed below to verify the efficacy of the disclosure, but the experimental content is not intended to limit the scope of the disclosure.

Experimental Example

In the following experimental examples, the method of fabricating the silicon carbide ingot was carried out according to the steps described in FIG. 2. The flow rate and the duration of introducing the argon gas, and the temperature and the duration of introducing the vanadium gas are executed in a manner described in Table 1 and Table 2. In the obtained silicon carbide crystal ingot, the ratio of the vanadium concentration and the nitrogen concentration at the seed end to the dome end and the resistivity are also shown in Table 1 and Table 2.

TABLE 1

|  | Experimental Example 1 | Experimental Example 2 | Experimental Example 3 | Experimental Example 4 | Experimental Example 5 |
| --- | --- | --- | --- | --- | --- |
| Vanadium concentration (seed end) | $5 * 10^{17}$ atoms/cm$^3$ | $6.3 * 10^{17}$ atoms/cm$^3$ | $7.2 * 10^{17}$ atoms/cm$^3$ | $8.3 * 10^{17}$ atoms/cm$^3$ | $9.9 * 10^{17}$ atoms/cm$^3$ |
| Vanadium concentration (dome end) | $4 * 10^{17}$ atoms/cm$^3$ | $1.2 * 10^{17}$ atoms/cm$^3$ | $1.1 * 10^{17}$ atoms/cm$^3$ | $3.3 * 10^{17}$ atoms/cm$^3$ | $5.1 * 10^{17}$ atoms/cm$^3$ |
| Nitrogen concentration (seed end) | $9.9 * 10^{16}$ atoms/cm$^3$ | $9.1 * 10^{16}$ atoms/cm$^3$ | $8.3 * 10^{16}$ atoms/cm$^3$ | $9.2 * 10^{16}$ atoms/cm$^3$ | $9.5 * 10^{16}$ atoms/cm$^3$ |
| Nitrogen concentration (dome end) | $5 * 10^{16}$ atoms/cm$^3$ | $4.2 * 10^{16}$ atoms/cm$^3$ | $4.3 * 10^{16}$ atoms/cm$^3$ | $3.2 * 10^{16}$ atoms/cm$^3$ | $6 * 10^{16}$ atoms/cm$^3$ |
| Ratio of vanadium to nitrogen at seed end (Vanadium:Nitrogen) | 5:1 | 6.9:1 | 8.7:1 | 9:1 | 10.4:1 |
| Ratio of vanadium to nitrogen at dome end (Vanadium:Nitrogen) | 8:1 | 2.9:1 | 2.6:1 | 10.3:1 | 8.5:1 |
| Resistivity at seed end (Ω · cm) | 100% is higher than $10^{12}$ | 100% is higher than $10^{12}$ | 100% is higher than $10^{12}$ | 100% is higher than $10^{12}$ | 100% is higher than $10^{12}$ |
| Resistivity at dome end (Ω · cm) | 90% higher than $10^{12}$ | 90% higher than $10^{12}$ | 90% higher than $10^{12}$ | 100% is higher than $10^{12}$ | 100% is higher than $10^{12}$ |
| Temperature of vanadium gas | 2150° C. | 2105° C. | 2105° C. | 2200° C. | 2220° C. |
| Flow rate of argon gas | 70 sccm | 70 sccm | 70 sccm | 80 sccm | 80 sccm |
| Evaluation | Good | Good | Good | Good | Good |

TABLE 2

|  | Comparative Example 6 | Comparative Example 7 | Comparative Example 8 | Comparative Example 9 | Comparative Example 10 |
| --- | --- | --- | --- | --- | --- |
| Vanadium concentration (seed end) | $5.5 * 10^{16}$ atoms/cm$^3$ | $8.9 * 10^{16}$ atoms/cm$^3$ | $2.2 * 10^{18}$ atoms/cm$^3$ | $4 * 10^{16}$ atoms/cm$^3$ | $1.8 * 10^{18}$ atoms/cm$^3$ |
| Vanadium concentration (dome end) | $4.5 * 10^{16}$ atoms/cm$^3$ | $3.3 * 10^{16}$ atoms/cm$^3$ | $2.1 * 10^{17}$ atoms/cm$^3$ | $2 * 10^{16}$ atoms/cm$^3$ | $2.6 * 10^{17}$ atoms/cm$^3$ |
| Nitrogen concentration (seed end) | $9.2 * 10^{16}$ atoms/cm$^3$ | $6.1 * 10^{16}$ atoms/cm$^3$ | $9.2 * 10^{16}$ atoms/cm$^3$ | $9.5 * 10^{16}$ atoms/cm$^3$ | $8.9 * 10^{16}$ atoms/cm$^3$ |
| Nitrogen concentration (dome end) | $5.3 * 10^{16}$ atoms/cm$^3$ | $2.2 * 10^{16}$ atoms/cm$^3$ | $2.5 * 10^{16}$ atoms/cm$^3$ | $1.3 * 10^{16}$ atoms/cm$^3$ | $1.8 * 10^{16}$ atoms/cm$^3$ |
| Ratio of vanadium to nitrogen at seed end (Vanadium:Nitrogen) | 0.6:1 | 1.5:1 | 24:1 | 4.2:1 | 20:1 |
| Ratio of vanadium to nitrogen at dome end (Vanadium:Nitrogen) | 0.8:1 | 1.7:1 | 24:1 | 1.5:1 | 14:1 |

TABLE 2-continued

|  | Comparative Example 6 | Comparative Example 7 | Comparative Example 8 | Comparative Example 9 | Comparative Example 10 |
|---|---|---|---|---|---|
| Resistivity at seed end ($\Omega \cdot cm$) | Less than 15% is higher than $10^{12}$ | 20% is higher than $10^{12}$ | 0% is higher than $10^{12}$ | 0% is higher than $10^{12}$ | 0% is higher than $10^{12}$ |
| Resistivity at dome end ($\Omega \cdot cm$) | Less than 15% is higher than $10^{12}$ | Less than 15% is higher than $10^{12}$ | 0% is higher than $10^{12}$ | 0% is higher than $10^{12}$ | 0% is higher than $10^{12}$ |
| Temperature of vanadium gas | 1850° C. | 1900° C. | 2500° C. | 2210° C. | 2000° C. |
| Flow rate of argon gas | 15 sccm | 30 sccm | 70 sccm | 30 sccm | 200 sccm |
| Evaluation | Bad | Bad | Bad | Bad | Bad |

As shown in the experimental results in Table 1, the silicon carbide crystal ingot with high resistance uniformity and high resistivity may be obtained when the temperature of the vanadium gas is controlled in the range of 2100° C. to 2250° C., and the argon gas flow rate is controlled in the range of 70 sccm to 80 sccm. As shown in the Experimental Examples 1 to 3, the portion with a resistivity higher than $10^{12}$ $\Omega \cdot cm$ at the seed end may occupies 100% of the area of the seed end, and the portion with a resistivity higher than $10^{12}$ $\Omega \cdot cm$ at the dome end occupies above 90% of the area of the dome end. In addition, as shown in the Experimental Examples 4 to 5, the portion with a resistivity higher than $10^{12}$ $\Omega \cdot cm$ at the seed end may occupies 100% of the area of the seed end, and the portion with a resistivity higher than $10^{12}$ $\Omega \cdot cm$ at the dome end occupies 100% of the area of the dome end.

In contrast, as shown in the Comparative Examples 6 and 7 of Table 2, the resistivity and the resistance uniformity of the formed silicon carbide crystal ingot are unable to meet the requirements when the temperature of the vanadium gas and the flow rate of the argon gas are too low. As shown in the Comparative Example 6, in the case of high nitrogen concentration, the vanadium doping concentration is insufficient. Therefore, the portion of either the seed end or the dome end with a resistivity higher than $10^{12}$ $\Omega \cdot cm$ occupies less than 15% of its area. In addition, as shown in the Comparative Example 7, in the case of low nitrogen concentration, the vanadium doping concentration is still insufficient. Therefore, the portion of the seed end with a resistivity higher than $10^{12}$ $\Omega \cdot cm$ is less than 20% of its area, and the portion of the dome end with a resistivity higher than $10^{12}$ $\Omega \cdot cm$ is less than 15% of its area.

In addition, as shown in the Comparative Example 8 in Table 2, even when the flow rate of the argon gas meets the requirements, the portion of either the seed end or the dome end with a resistivity higher than $10^{12}$ $\Omega \cdot cm$ is 0% when the temperature of the vanadium gas is too high (2500° C.), which is unable to meet the requirement of high resistivity. As shown in the Comparative Example 9 in Table 2, even when the temperature of the introduced vanadium gas meets the requirements, the portion of either the seed end or the dome end with a resistivity higher than $10^{12}$ $\Omega \cdot cm$ is 0% when the argon gas flow rate is too low (30 sccm), which is unable meet the requirement of high resistivity. Similarly, as shown in the Comparative Example 10 in Table 2, even when the temperature of the vanadium gas meets the requirement, the portion of either the seed end or the dome end with a resistivity higher than $10^{12}$ $\Omega \cdot cm$ is 0% when the argon gas flow rate is too high (200 sccm), which is unable to meet the requirement of high resistivity. Based on this, it can be known from the above Experimental Examples and the Comparative Examples that it is beneficial to control the temperature of the vanadium gas in the range of 2100° C. to 2250° C. and the flow rate of the argon gas in the range of 70 sccm to 80 sccm so as to obtain a silicon carbide ingot with high resistance uniformity and high resistivity.

In summary, the silicon carbide ingot formed by the method of fabricating the same according to the embodiment of the disclosure is doped by introducing gaseous molecules of vanadium, and the doping concentration of vanadium and the concentration of nitrogen are controlled within a certain proportional relationship, which enables the silicon carbide crystal ingot to have high resistance uniformity and high resistivity. Accordingly, the wafers/chips produced by the silicon carbide ingot of the disclosure will also have higher quality.

Although the disclosure has been disclosed with the foregoing exemplary embodiments, it is not intended to limit the disclosure. Any person skilled in the art can make various changes and modifications within the spirit and scope of the disclosure. Accordingly, the scope of the disclosure is defined by the claims appended hereto and their equivalents.

What is claimed is:

1. A silicon carbide ingot, comprising:
   a seed end and a dome end opposite to the seed end, wherein a ratio of vanadium concentration to nitrogen concentration at the seed end is in a range of 5:1 to 11:1, and a ratio of the vanadium concentration to the nitrogen concentration at the dome end is in a range of 2:1 to 11:1, and wherein
   the vanadium concentration at the seed end is within a range of $6.3*10^{17}$ atoms/cm$^3$ to $9.9*10^{17}$ atoms/cm$^3$, and
   the vanadium concentration at the dome end is within a range of $10^{17}$ atoms/cm$^3$ to $5*10^{17}$ atoms/cm$^3$.

2. The silicon carbide ingot according to claim 1, wherein a portion of the seed end with a resistivity higher than $10^{12}$ $\Omega \cdot cm$ occupies 100% of an area of the seed end, and a portion of the dome end with a resistivity higher than $10^{12}$ $\Omega \cdot cm$ occupies more than 90% of an area of the dome end.

3. The silicon carbide ingot according to claim 2, wherein the portion of the dome end with the resistivity higher than $10^{12}$ $\Omega \cdot cm$ occupies 100% of the area of the dome end.

4. The silicon carbide ingot according to claim 1, wherein the nitrogen concentration at the seed end and the dome end is within a range of $10^{16}$ atoms/cm$^3$ to $9.9*10^{16}$ atoms/cm$^3$.

5. The silicon carbide ingot according to claim 4, wherein the nitrogen concentration at the seed end is within a range of $5*10^{16}$ atoms/cm$^3$ to $9.9*10^{16}$ atoms/cm$^3$.

6. The silicon carbide ingot according to claim 4, wherein the nitrogen concentration at the dome end is within a range of $10^{16}$ atoms/cm$^3$ to $5*10^{16}$ atoms/cm$^3$.

* * * * *